(12) United States Patent
Zuniga et al.

(10) Patent No.: US 8,936,980 B1
(45) Date of Patent: Jan. 20, 2015

(54) DUAL GATE LATERAL DOUBLE-DIFFUSED MOSFET (LDMOS) TRANSISTOR

(71) Applicant: Volterra Semiconductor Corporation, Fremont, CA (US)

(72) Inventors: Marco A. Zuniga, Palo Alto, CA (US); Budong You, Fremont, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 47 days.

(21) Appl. No.: 13/784,559

(22) Filed: Mar. 4, 2013

Related U.S. Application Data

(62) Division of application No. 12/174,471, filed on Jul. 16, 2008, now Pat. No. 8,390,057, and a division of application No. 11/031,381, filed on Jan. 7, 2005, now Pat. No. 7,405,443.

(51) Int. Cl.
*H01L 29/72* (2006.01)
*H01L 29/66* (2006.01)

(52) U.S. Cl.
CPC ............................... *H01L 29/66681* (2013.01)
USPC ............ 438/197; 438/286; 438/301; 438/306

(58) Field of Classification Search
USPC .................................. 438/197, 286, 301, 306
See application file for complete search history.

(56) References Cited

U.S. PATENT DOCUMENTS

| | | | |
|---|---|---|---|
| 4,769,686 A | 9/1988 | Horiuchi et al. | |
| 5,237,193 A * | 8/1993 | Williams et al. | 257/336 |
| 5,275,961 A | 1/1994 | Smayling et al. | |
| 5,430,403 A * | 7/1995 | Moyer et al. | 327/565 |
| 5,610,421 A | 3/1997 | Contiero et al. | |
| 5,648,288 A | 7/1997 | Williams et al. | |
| 5,773,852 A * | 6/1998 | Han et al. | 257/139 |
| 5,789,785 A | 8/1998 | Ravanelli et al. | |
| 5,834,851 A | 11/1998 | Ikeda et al. | |
| 6,078,082 A | 6/2000 | Bulucea | |
| 6,160,289 A | 12/2000 | Kwon et al. | |
| 6,252,278 B1 | 6/2001 | Hsing | |
| 6,384,643 B1 | 5/2002 | Grose et al. | |
| 6,399,468 B2 | 6/2002 | Nishibe et al. | |
| 6,400,126 B1 | 6/2002 | Zuniga et al. | |
| 6,441,431 B1 | 8/2002 | Efland et al. | |
| 6,538,288 B2 | 3/2003 | Lee et al. | |
| 6,563,175 B2 | 5/2003 | Shiau et al. | |
| 6,605,844 B2 | 8/2003 | Nakamura et al. | |
| 6,642,697 B2 | 11/2003 | Zuniga et al. | |
| 6,667,500 B2 * | 12/2003 | Sicard et al. | 257/288 |
| 6,825,531 B1 * | 11/2004 | Mallikarjunaswamy | 257/343 |
| 6,855,985 B2 | 2/2005 | Williams et al. | |

(Continued)

OTHER PUBLICATIONS

Request for Ex Parte Reexamination and Order Granting Request for Ex Parte Reexamination, Control No. 90/011,079 (re-examination of US Patent No. 7,405,443), 13 pages, Jul. 2, 2010.

*Primary Examiner* — Edward Wojciechowicz
(74) *Attorney, Agent, or Firm* — Lathrop & Gage LLP

(57) ABSTRACT

Method and apparatus for providing a lateral double-diffused MOSFET (LDMOS) transistor having a dual gate. The dual gate includes a first gate and a second gate. The first gate includes a first oxide layer formed over a substrate, and the second gate includes a second oxide layer formed over the substrate. The first gate is located a pre-determined distance from the second gate. A digitally implemented voltage regulator is also provided that includes a switching circuit having a dual gate LDMOS transistor.

13 Claims, 10 Drawing Sheets

(56) References Cited

U.S. PATENT DOCUMENTS

| | | |
|---|---|---|
| 6,894,350 B2 * | 5/2005 | Shimizu et al. ............... 257/343 |
| 6,897,525 B1 | 5/2005 | Kikuchi et al. |
| 6,911,694 B2 | 6/2005 | Negoro et al. |
| 6,927,453 B2 | 8/2005 | Shibib et al. |
| 7,005,703 B2 | 2/2006 | Shibib et al. |
| 7,038,274 B2 * | 5/2006 | You et al. ..................... 257/335 |
| 7,074,659 B2 | 7/2006 | Zuniga et al. |
| 7,163,856 B2 | 1/2007 | You et al. |
| 7,220,633 B2 | 5/2007 | You et al. |
| 7,405,117 B2 | 7/2008 | Zuniga et al. |
| 7,666,731 B2 | 2/2010 | You et al. |
| 2001/0009790 A1 | 7/2001 | Hsing |
| 2002/0009790 A1 | 1/2002 | Christensen et al. |
| 2002/0011626 A1 | 1/2002 | Croce et al. |
| 2002/0030238 A1 | 3/2002 | Nakamura et al. |
| 2002/0079514 A1 | 6/2002 | Hower et al. |
| 2002/0089790 A1 | 7/2002 | Stoebe et al. |
| 2002/0106860 A1 * | 8/2002 | Nishibe et al. ................ 438/305 |
| 2003/0141559 A1 * | 7/2003 | Moscatelli et al. ........... 257/406 |
| 2004/0046226 A1 | 3/2004 | Himi et al. |
| 2004/0180485 A1 | 9/2004 | Beasom |
| 2004/0238913 A1 | 12/2004 | Kwon et al. |
| 2005/0006701 A1 | 1/2005 | Sung et al. |
| 2005/0106791 A1 | 5/2005 | You et al. |
| 2005/0106825 A1 | 5/2005 | You et al. |
| 2007/0166896 A1 | 7/2007 | You et al. |

* cited by examiner

DUAL GATE LATERAL DOUBLE-DIFFUSED MOSFET (LDMOS) TRANSISTOR

CROSS-REFERENCED TO RELATED APPLICATIONS

This application is a divisional of U.S. application Ser. No. 12/174,471, filed Jul. 16, 2008 which is a divisional of U.S. application Ser. No. 11/031,381, filed Jan. 7, 2005, now U.S. Pat. No. 7,405,443. The disclosures of the prior applications are incorporated by reference.

BACKGROUND

The following disclosure relates to semiconductor devices, and more particularly to a lateral double-diffused MOSFET (LDMOS) device.

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC-to-DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

Double-diffused drain (DDD) CMOS devices are commonly employed in switching regulators. DDD devices achieve high voltage tolerance through the introduction of a thick gate oxide (e.g., approximately 75 Angstroms for 3.3V applications and approximately 350 Angstroms for 12V applications) and a resistive implant at the drain. A voltage rating of a DDD device is typically determined by both the gate length and the spacing between the drain contact and the gate; thus establishing a trade-off between voltage rating and device performance.

FIG. 1A shows a conventional DDD CMOS device 100 on a p-type substrate 102. DDD CMOS device 100 includes a drain region 104 with an n-doped n+ region 106, and an n-doped deep drain (NDD) 108. Additionally, DDD CMOS device 100 includes a source region 112 and a single gate 114. Source region 112 includes an n-doped n+ region 116, and an p-doped p+ region 118. Gate 114 includes a conductive layer 120 (e.g., a polysilicon layer) and a thick oxide layer 122.

As shown in FIG. 1A, n+ region 106 can be self-aligned with respect to gate 114—i.e., n+ region 106 can be implanted into p-type substrate 102 after formation of gate 114 (during fabrication of DDD CMOS device 100). However, when n+ region 106 is self-aligned with respect to gate 114, n+ region 106 cannot have an offset (or spacing) from gate 114. Alternatively, n+ region 106 can have a predetermined offset (d) from gate 114 as shown in FIG. 1B. However, generally when n+ region 106 has an offset spacing (e.g., offset spacing (d)) with respect to gate 114, n+ region 106 is not typically self-aligned with respect to a gate (e.g., gate 114).

SUMMARY

In general, in one aspect, this specification describes a transistor including a source region, a dual gate, and a drain region.

The source region includes a first impurity region, a second impurity region and a third impurity region. The first impurity region is implanted into a surface of a substrate. The second impurity region is implanted within the first impurity region, and the third impurity region is implanted into the first impurity region adjacent to the second impurity region. The second and third impurity regions provide ohmic contacts for the transistor.

The dual gate includes a first gate and a second gate. The first gate includes a first oxide layer formed over the substrate, and the second gate includes a second oxide layer formed over the substrate. The first gate is located a pre-determined distance from the second gate.

The drain region includes a fourth impurity that provides an ohmic contact for the transistor. The fourth impurity region has an offset spacing from the first gate and is self aligned with respect to the second gate.

Particular implementations can include one or more of the following features. The drain region can further include a fifth impurity region. The fifth impurity can be non-self aligned with respect to the first gate and the second gate. The fifth impurity region can be self-aligned with respect to the first gate or the second gate. A length of the offset spacing of the fourth impurity region from the first gate can be indirectly controlled by a mask that controls a length of the pre-determined distance between the first gate and the second gate. The first oxide layer of the first gate can be thicker than the second oxide layer of the second gate. The pre-determined distance between the first gate and the second gate can be substantially equal to zero such that the first gate abuts the second gate. The first oxide layer of the first gate and the second oxide layer of the second gate can be of substantially the same thickness. The first gate and/or the second gate can be a controlled gate that receives a control voltage to activate the transistor. The second gate can float or be coupled to a pre-determined reference voltage. The transistor can be a lateral double-diffused MOSFET (LDMOS) transistor. The second impurity region and the third impurity regions can be of opposite impurity types.

In general, in another aspect, this specification describes a method of fabricating a transistor having a source region, a drain region, and a gate on a substrate. A first impurity region having a first volume and a first surface area is implanted into a surface of the substrate. The first impurity region is of a first type. A second impurity region is implanted into a source region of the transistor. The second impurity region has a second volume and a second surface area in the first surface area of the first impurity region. The second impurity region is of an opposite second type relative to the first type. A third impurity region is implanted into a drain region of the transistor. The third impurity region has a third volume and a third surface area and is of the first type. A first gate oxide and a second gate oxide are formed between the source region and the drain region of the transistor. The first gate oxide is formed a pre-determined distance (g) from the second gate oxide. The first gate oxide and the second gate oxide are covered with a conductive material to form a first gate and a second gate, respectively, of the transistor. A fourth impurity region is implanted into the drain region of the transistor. The fourth impurity region has a fourth volume and a fourth surface area and is of the first type. The fourth impurity region has an offset spacing from the first gate and is self aligned with respect to the second gate.

Particular implementations can include one or more of the following features. A fifth impurity region can be implanted into the drain region of the transistor. The fifth impurity region can have a fifth volume and a fifth surface area in the first surface area of the first impurity region. The sixth impurity region can be self aligned to the first gate of the transistor and be implanted prior to formation of the second gate oxide. The sixth impurity region can be self aligned to the second gate of the transistor. The sixth impurity region can be non-self aligned with respect to the first gate and the second gate.

In general, in another aspect, this specification describes a voltage regulator having an input terminal and an output terminal. The voltage regulator includes a first LDMOS transistor, a second LDMOS transistor, a controller, and a filter. The first LDMOS transistor connects the input terminal to an intermediate terminal. The first LDMOS transistor includes a first gate and a second gate. The first gate includes a first gate oxide layer, and the second gate includes a second gate oxide layer. The second LDMOS transistor connects the intermediate terminal to ground. The controller drives the first LDMOS transistor and the second LDMOS transistor to alternately couple the intermediate terminal between the input terminal and ground to generate an intermediate voltage at the intermediate terminal having a rectangular waveform. The filter is disposed between the intermediate terminal and the output terminal to convert the rectangular waveform into a substantially DC voltage at the output terminal.

Particular implementations can include one or more of the following features. Each of the first gate and the second gate can be controlled gates. The first gate can a controlled gate while the second gate is a non-controlled gate. The second gate can float or be coupled to a pre-determined reference voltage. The first gate oxide and the second gate oxide can have substantially the same thickness. The first gate oxide can be thinner than the second gate oxide. The first gate can abut the second gate or be spaced a pre-determined distance (g) from the second gate.

The second LDMOS transistor can include a third gate and a fourth gate. The third gate can include a third gate oxide layer, and the fourth gate can include a fourth gate oxide layer. Each of the third gate and the fourth gate can be a controlled gate. The third gate can be a controlled gate while the fourth gate is a non-controlled gate. The fourth gate can float or be coupled to a pre-determined reference voltage. The third gate oxide and the fourth gate oxide can have substantially the same thickness. The third gate oxide and the fourth gate oxide can have thick gate oxides, and the gate oxides can have a thickness of approximately 75 Angstroms for 3.3V applications and a thickness of approximately 350 Angstroms for 12V applications. The third gate can abut the fourth gate or be spaced a pre-determined distance (g) from the fourth gate.

Implementations can include one or more of the following advantages. Advantages of the invention may include the following. A double-diffused drain transistor is provided that includes a dual gate. The dual gate permits the double-diffused drain device to have on offset n+ region that is also self-aligned. A length of the offset of the n+ region can be controlled indirectly through control of a distance between a first gate and a second gate of the dual gate. A second gate of the dual gate can be controlled (by a control voltage) to enhance a tradeoff between a specific on-resistance (Rdson) and a drain-to-source breakdown voltage ($BV_{d\_s}$) of the double-diffused drain transistor. The tradeoff can be determined by controlling the amount of charge underneath the second gate—e.g., higher charge results in a lover $R_{ds\_on}$ and a lower charge results in a higher $BV_{d\_s}$.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1A:
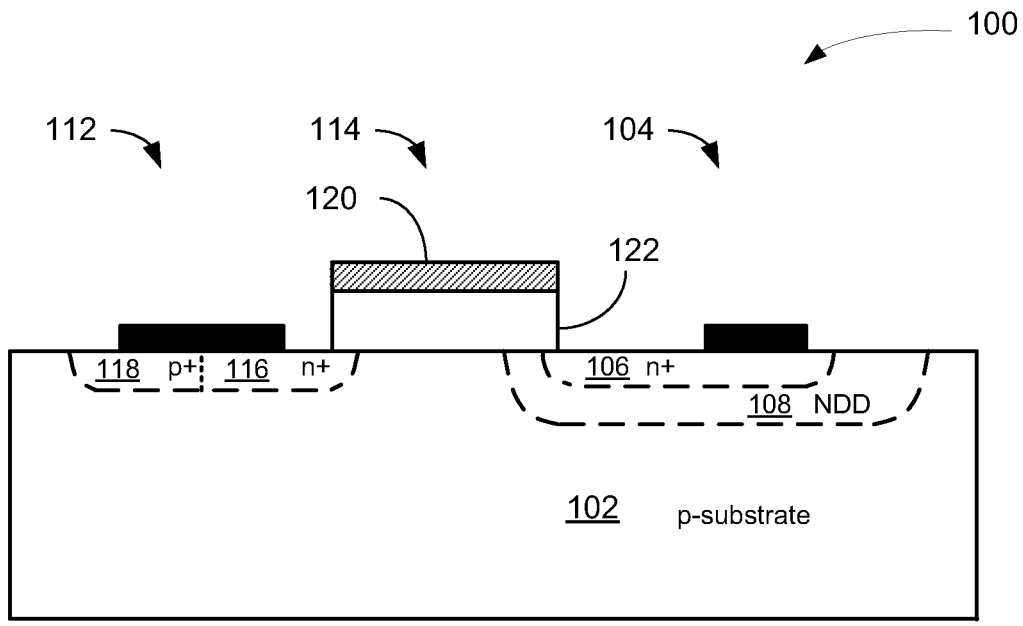
FIGS. 1A and 1B are schematic cross-sectional views of conventional double-diffused drain CMOS devices.
Figure 1B:
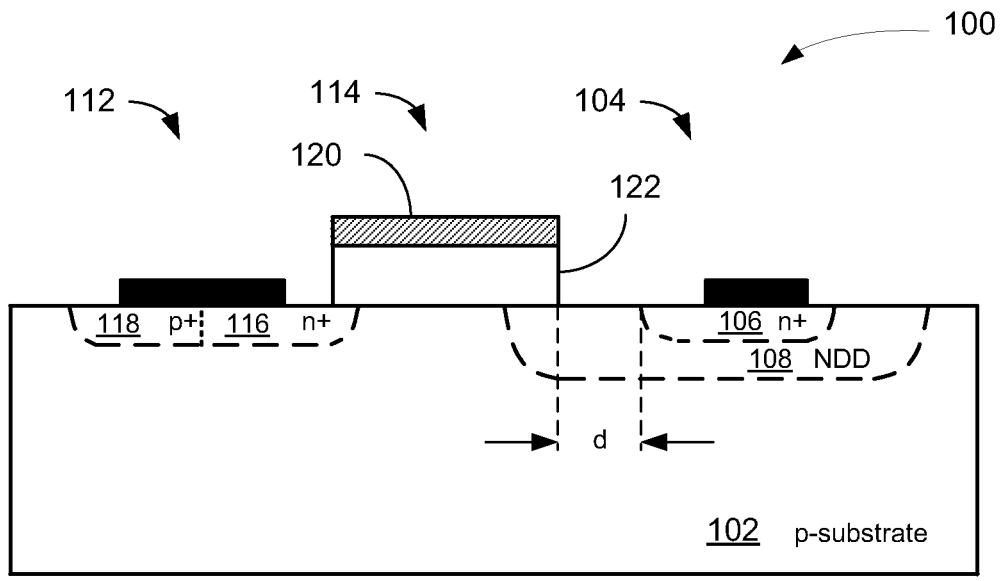
Figure 2:
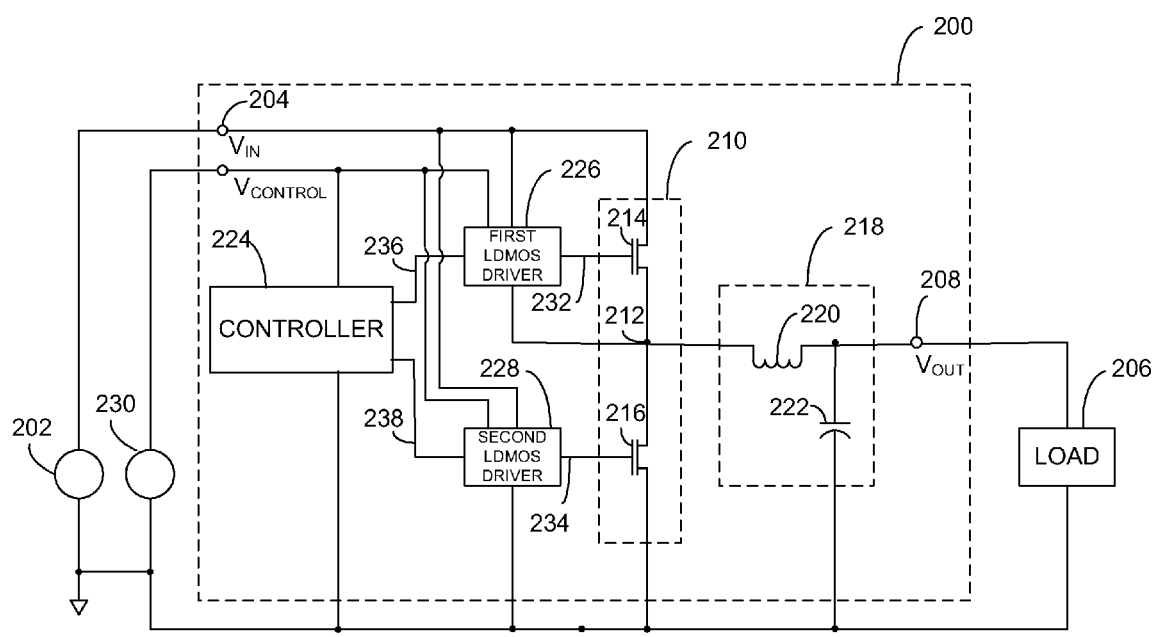
FIG. 2 is a block diagram of a buck switching regulator.

FIG. 2 is a block diagram of a switching regulator 200 including a lateral double-diffused MOSFET (LDMOS) transistor according to one implementation. Conventional double-diffused drain transistors typically include a single gate and a drain region, and the drain region does not include a self aligned n+ region that is offset with respect to the single gate. According to one aspect of the invention, a LDMOS transistor is provided that includes a self aligned n+ region that is offset with respect to a gate. In addition, a LDMOS transistor is provided that can be fabricated through a process that can be seamlessly integrated into a typical sub-micron CMOS process.

Referring to FIG. 2, a switching regulator 200 is coupled to a first high DC input voltage source 202, such as a battery, by an input terminal 204. Switching regulator 200 is also coupled to a load 206, such as an integrated circuit, by an output terminal 208. Switching regulator 200 serves as a DC-to-DC converter between input terminal 204 and output terminal 208. Switching regulator 200 includes a switching circuit 210 which serves as a power switch for alternately coupling and decoupling input terminal 204 to an intermediate terminal 212. Switching circuit 210 includes a rectifier—e.g., a switch or diode—that couples intermediate terminal 212 to a low voltage potential (e.g., ground). Specifically, switching circuit 210 can include a first transistor 214 having a drain connected to input terminal 204 and a source connected to intermediate terminal 212 and a second transistor 216 having a source connected to a low voltage potential (e.g., ground) and a drain connected to intermediate terminal 212. In one implementation, each of first transistor 214 and second transistor 216 is a lateral double-diffused MOSFET (LD-MOS) transistor.

Intermediate terminal 212 is coupled to output terminal 208 by an output filter 218. Output filter 218 converts a rectangular waveform of an intermediate voltage at intermediate terminal 212 into a substantially DC output voltage at output terminal 208. Specifically, in a buck-converter topology, output filter 218 includes an inductor 220 connected between intermediate terminal 212 and output terminal 208, and a capacitor 222 connected in parallel with load 206. In one implementation, during a first conduction period, first transistor 214 is closed, and voltage source 202 supplies energy to load 206 and inductor 220 through first transistor 214, whereas during a second conduction period, second transistor 216 is closed, and current flows through second transistor 216 as energy is supplied by inductor 220. The resulting output voltage $V_{out}$ is a substantially DC voltage.

In one implementation, switching regulator 200 includes a controller 224, a first LDMOS driver 226 and a second LDMOS driver 228 for controlling the operation of switching circuit 200. LDMOS driver 226 and LDMOS driver 228 are coupled to a voltage source 230. A first control line 232 connects first transistor 214 to LDMOS driver 226, and a second control line 234 connects second transistor 216 to LDMOS driver 228. LDMOS driver 226 and LDMOS driver 228 are connected to controller 224 by control lines 236 and 238, respectively. Controller 224 causes switching circuit 200 to alternate between first and second conduction periods so as to generate an intermediate voltage $V_{int}$ at intermediate terminal 212 that has a rectangular waveform. Controller 224 can also include a feedback circuit (not shown), which measures an output voltage and a current passing through output terminal 208. In one implementation, controller 224 is a pulse width modulator. Other modulation schemes can also be used, e.g., pulse frequency modulation.

Although the switching regulator discussed above has a buck converter topology, the invention is also applicable to other voltage regulator topologies—e.g., a boost converter or a buck-boost converter, and to RF output amplifiers.

Figure 3A:
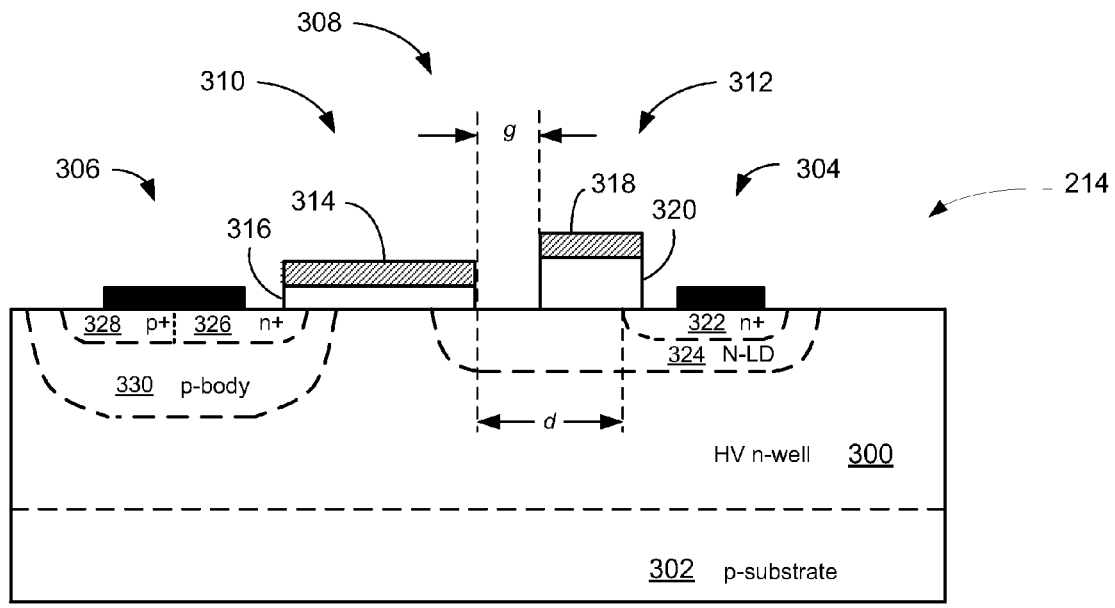
FIG. 3A is a schematic cross-sectional view of a lateral double-diffused MOSFET (LDMOS) device from the switching regulator of FIG. 2 in one implementation.

FIG. 3A shows a schematic cross-sectional view of first transistor 214 in one implementation. In this implementation, first transistor 214 is a LDMOS transistor (referred to herein as LDMOS transistor 214). LDMOS transistor 214 can be fabricated on a high voltage n-type well (HV n-well) 300 implanted in a p-type substrate 302. An HV n-well implant is typically a deep implant and is generally more lightly doped relative to a conventional CMOS n-well. HV n-well 300 can have a retrograded vertical doping profile. LDMOS transistor 214 includes a drain region 304, a source region 306, and a dual gate 308.

Dual gate 308 includes a first gate 310 and a second gate 312. In one implementation, first gate 310 is a controlled gate and second gate 312 is a non-controlled gate. A controlled gate is a gate that receives a voltage that can activate—i.e., turn on or off—a corresponding transistor. Second gate 312 can float or be coupled to a pre-determined reference voltage (not shown). Alternatively, both first gate 310 and second gate 312 can be controlled gates. First gate 310 includes a conductive layer 314 and an oxide layer 316. Second gate 312 includes a conductive layer 318 and an oxide layer 320. Each of conductive layers 314, 318 can be a layer of polysilicon. As shown in FIG. 3A, oxide layer 320 is thicker than oxide layer 316. The thinner oxide layer provided by oxide layer 316 permits transistor 216 to be controlled by a lower gate voltage relative to a transistor having a controlled gate with a thicker oxide layer. In the implementation shown in FIG. 3A, second gate 312 is spaced a pre-determined distance (g) from first gate 310. Distance (g) can be controlled through a mask during fabrication of transistor 214. In an implementation in which first gate 310 has a thinner oxide layer with respect to second gate 312 distance (g) can be shortened to an extent such that first gate 310 abuts second gate 312 as shown in FIG. 3B—i.e., distance (g) is substantially equal to zero.

Figure 3B:
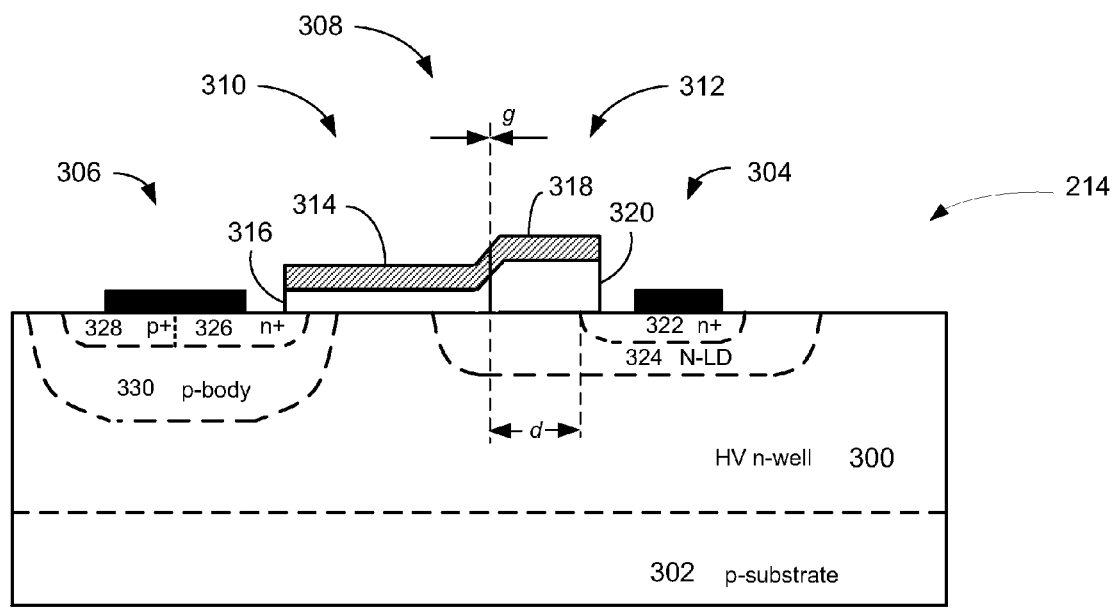
FIG. 3B is a schematic cross-sectional view of a LDMOS device from the switching regulator of FIG. 2 in another implementation.
Figure 3C:
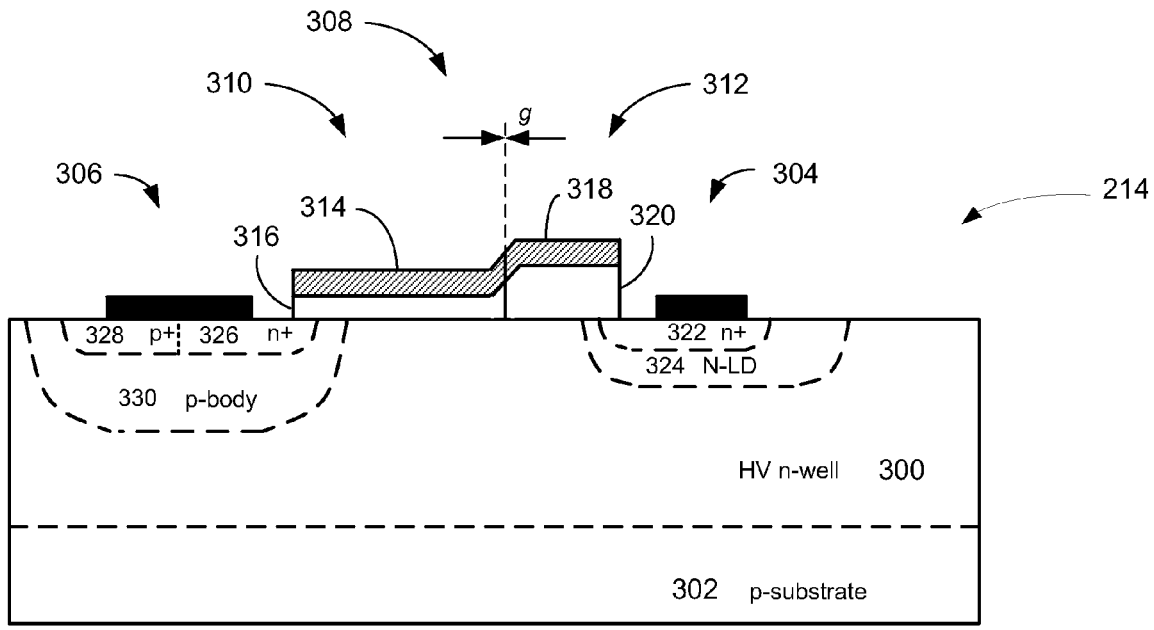
FIG. 3C is a schematic cross-sectional view of a LDMOS device from the switching regulator of FIG. 2 in another implementation.
Figure 3D:
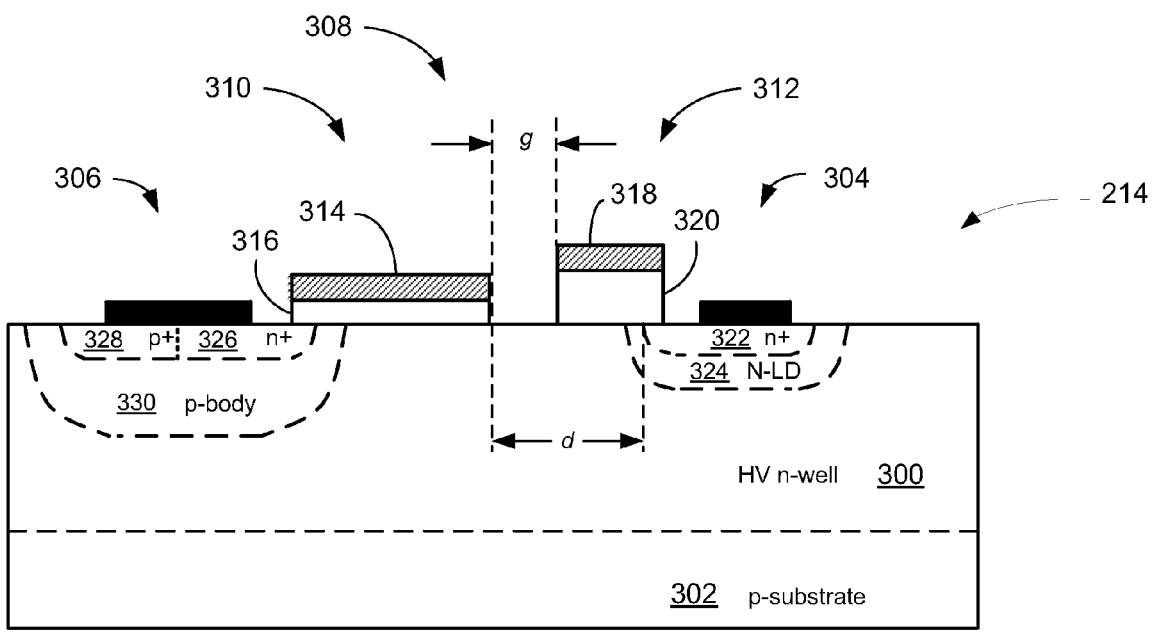
FIG. 3D is a schematic cross-sectional view of a LDMOS device from the switching regulator of FIG. 2 in another implementation.

Referring again to FIG. 3A, drain region 304 includes an n-doped n+ region 322 and an n-doped shallow drain (N-LD) 324. N+ region 322 has an offset spacing (d) with respect to first gate 310 and is self-aligned with respect to second gate 312. In one implementation, a length of offset spacing (d) is controlled indirectly through a mask that controls distance (g) between first gate 310 and second gate 312. A size of second gate 312 can also be used to control the length of offset spacing (d). In one implementation, N-LD 324 is self-aligned with respect to first gate 310 (as shown in FIGS. 3A, 3B). In such an implementation, N-LD 324 extends completely under second gate 312. Alternatively, N-LD 324 can be self-aligned with respect to second gate 312 as shown in FIG. 3C (where distance (g) is substantially equal to zero) and FIG. 3D (where distance (g) is greater than zero). In an implementation where N-LD 324 is self-aligned with respect to second gate 312, N-LD 324 does not completely extend underneath second gate 312. N-LD 324 can also be non-self aligned.

As shown in FIG. 3A, source region 306 includes an n-doped n+ region 326, a p-doped p+ region 328, and a p-doped P-body 330, and drain region 304 includes HV n-well 300, N-LD 324, and n+ region 322. Each of n+ region 326, p+ region 328, P-body 330, HV n-well 300, N-LD 324, and n+ region 322 are volumes composed of doped material, and each region is defined by a given implant step within a semiconductor manufacturing process. In one implementation, each of N-LD 324 and HV n-well 300 have a lower concentration of impurities than n+ region 322. However, portions at which these volumes overlap have a higher doping concentration than the individual volumes separately. For example, a portion that contains the overlapping volumes of n+ region 322, N-LD 324, and HV n-well 300 has the highest doping concentration of all the overlapping volume portions. Likewise, n+ region 326, p+ region 328, and P-body 330 in source region 306 are volumes composed of doped material.

Figure 4A:
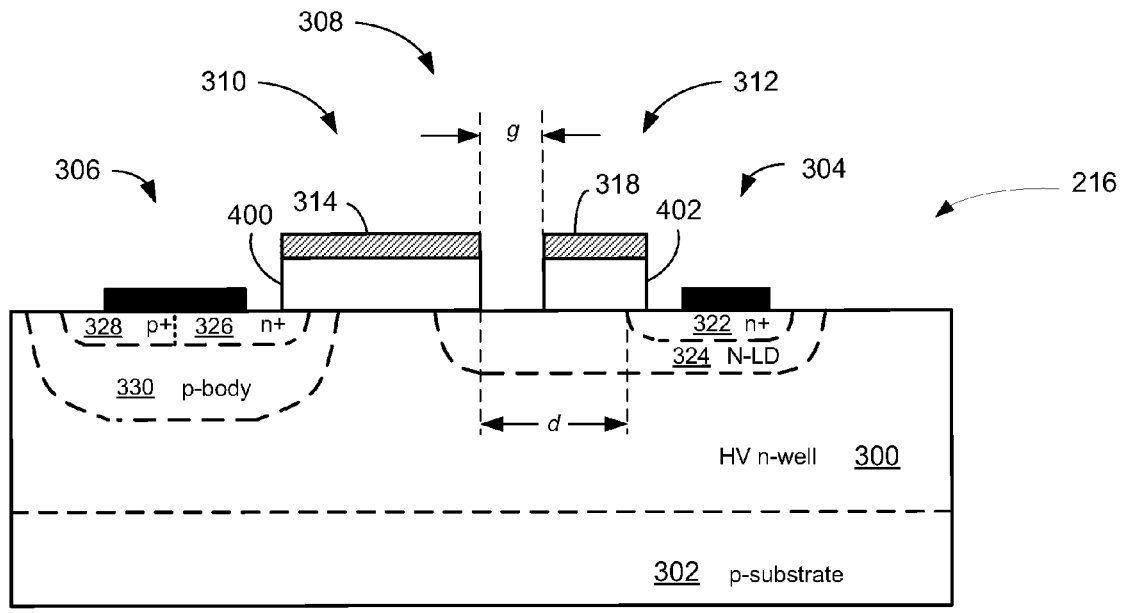
FIG. 4A is a schematic cross-sectional view of a LDMOS device from the switching regulator of FIG. 2 in another implementation.
Figure 4B:
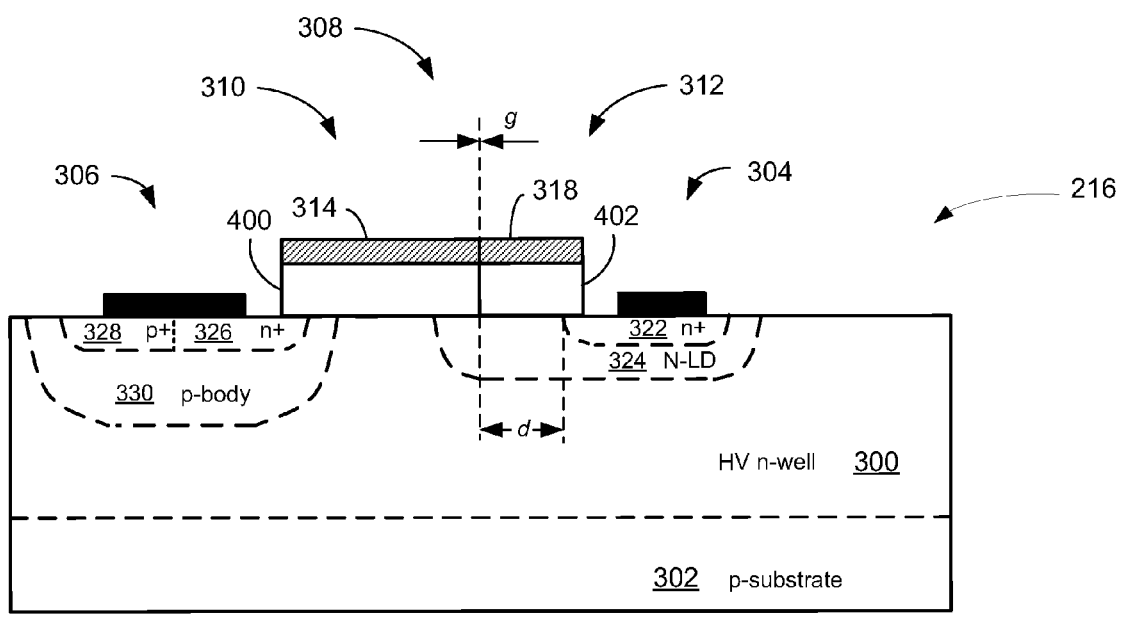
FIG. 4B is a schematic cross-sectional view of a LDMOS device from the switching regulator of FIG. 2 in another implementation.
Figure 4C:
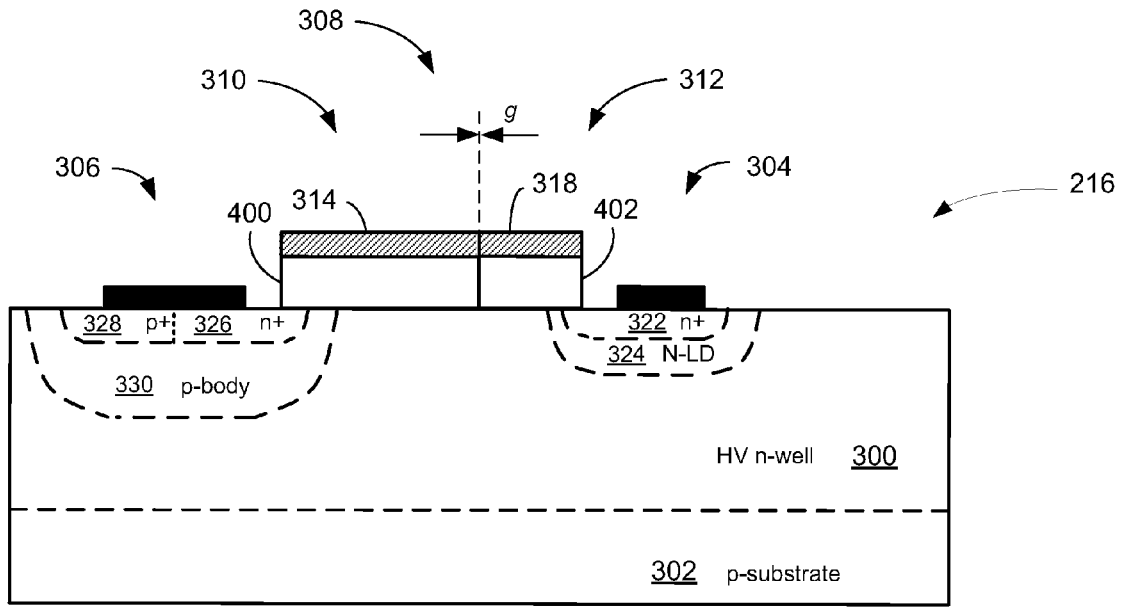
FIG. 4C is a schematic cross-sectional view of a LDMOS device from the switching regulator of FIG. 2 in another implementation.

FIG. 4A shows a schematic cross-sectional view of second transistor 216 in one implementation. In this implementation, second transistor 216 is a LDMOS transistor (referred to herein as LDMOS transistor 216). LDMOS transistor 216 has a similar construction as LDMOS transistor 214, and accordingly, includes many of the same reference designations as LDMOS transistor 214 (shown in FIG. 3A). As shown in FIG. 4A, first gate 310 and second gate 312 have thick oxide layers 400, 402, respectively. Oxide layers 400, 402 can have substantially the same thickness. In this implementation, LDMOS transistor 216 can be controlled by a higher gate voltage relative to a transistor having a controlled gate with a thinner oxide layer. In addition, first gate 310 and second gate 312 can be controlled by a single control voltage (or bias voltage). In one implementation, when first gate 310 and second gate 312 have oxide layers that are of substantially the same thickness, a minimum pre-determined length is maintained for distance (g) between first gate 310 and second gate 312. The minimum pre-determined length for distance (g) can be controlled through a mask during fabrication of LDMOS transistor 216. Alternatively, first gate 310 and second gate 312 can abut one another as shown in FIGS. 4B-4C. FIG. 4B shows N-LD 324 self-aligned with respect to first gate 310. FIG. 4C shows N-LD 324 self-aligned with respect to second gate 312.

Figure 5:
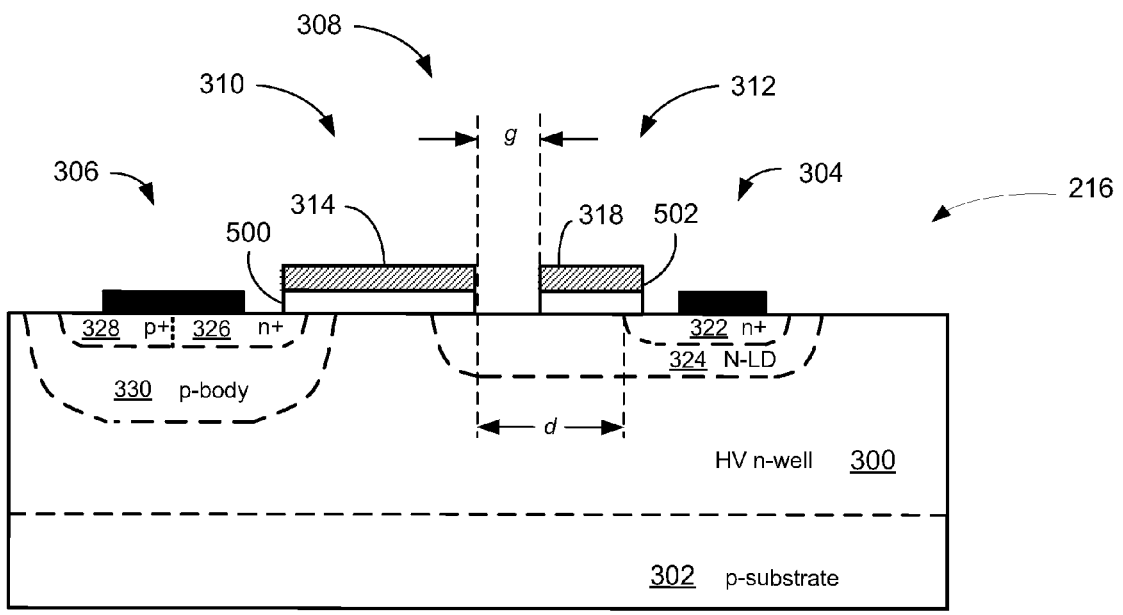
FIG. 5 is a schematic cross-sectional view of a LDMOS device from the switching regulator of FIG. 2 in another implementation.

FIG. 5 shows a schematic cross-sectional view of LDMOS transistor 216 in another implementation. As shown in FIG. 5, first gate 310 and second gate 312 have thin oxide layers 500, 502, respectively. Oxide layers 500, 502 can have substantially the same thickness. In this implementation, LDMOS transistor 216 can be controlled by a lower gate voltage relative to a transistor having a controlled gate with a thicker oxide layer. As discussed above, in implementations where first gate 310 and second gate 312 have oxide layers that are of substantially the same thickness, a minimum pre-determined length can be maintained for distance (g) between first gate 310 and second gate 312. In addition, when each of first gate 310 and second gate 312 have thin oxide layers—e.g., as oxide layers 500, 502—a minimum pre-determined length for offset spacing (d) is generally maintained to avoid breakdown of drain region 304 when LDMOS transistor 216 is activated.

Figure 6:
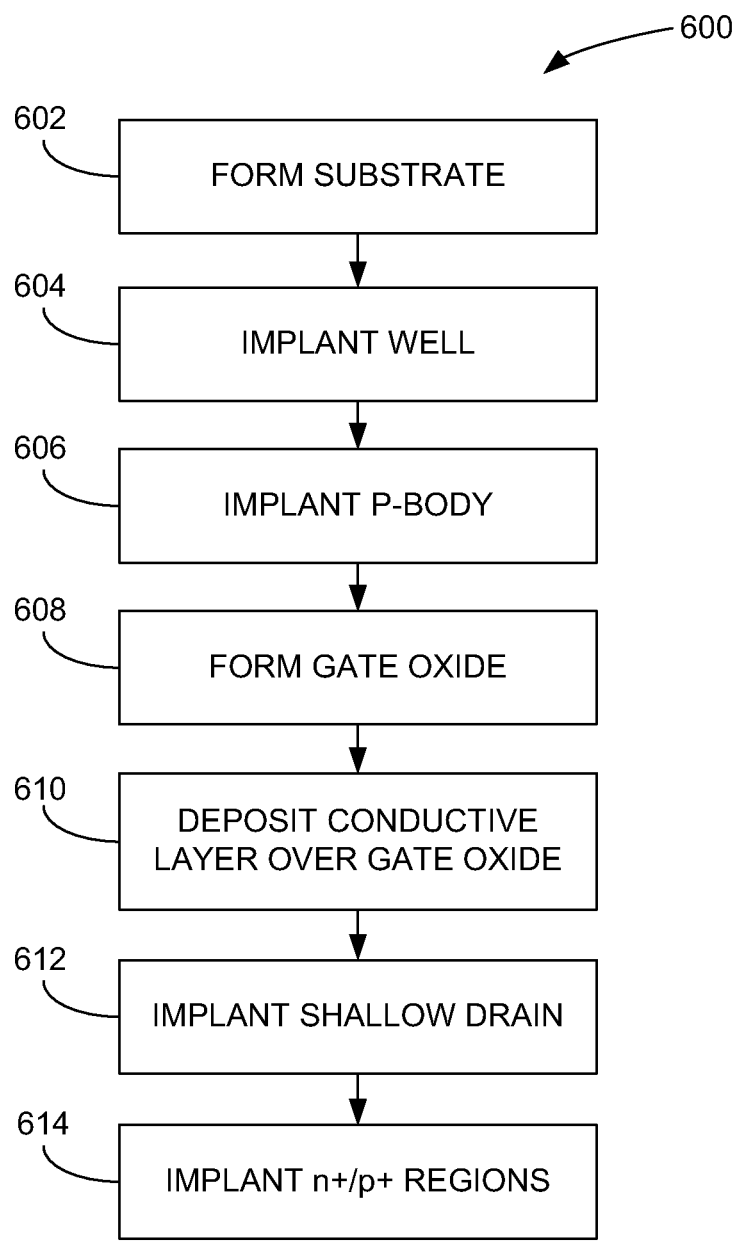
FIG. 6 is a flow diagram illustrating a process for manufacturing a semiconductor device including a LDMOS device according to a CMOS process flow.

FIG. 6 illustrates a process 600 of fabricating a LDMOS transistor (e.g., LDMOS transistors 214, 216) through a CMOS process flow.

Figure 7A:
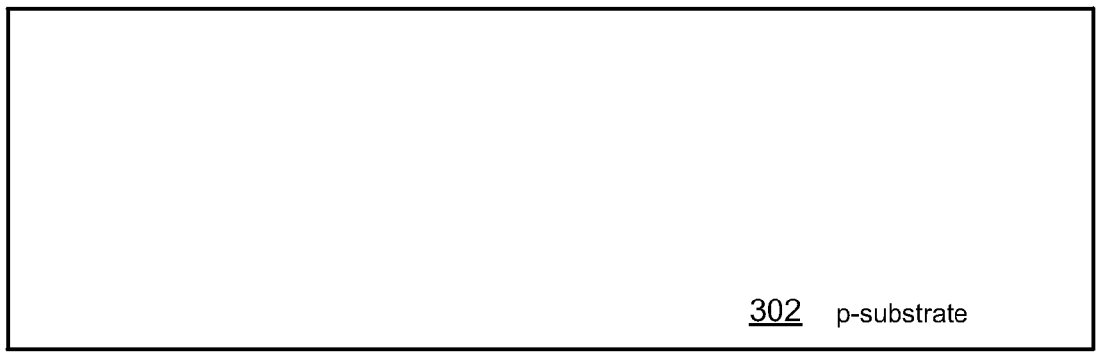
FIGS. 7A-7G illustrate the process of manufacturing a LDMOS transistor according to the process of FIG. 6.
Figure 7B:
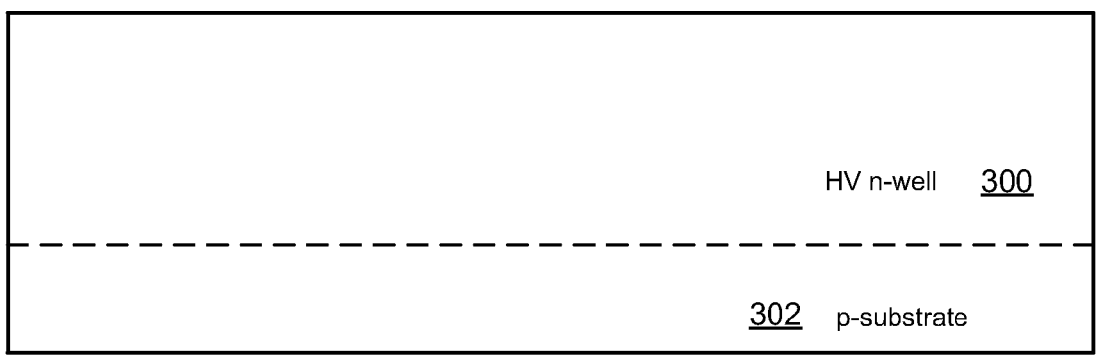
Figure 7C:
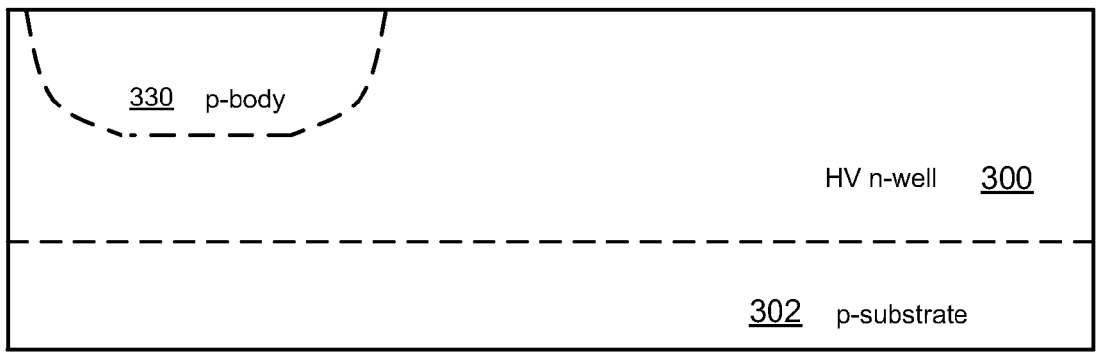

Process 600 begins with forming a substrate (step 602). The substrate can be a p-type substrate or an n-type substrate. Referring to the example of FIG. 7A, a semiconductor layer consisting of a p-type substrate 302 can be formed. A well for the LDMOS transistor is implanted into the substrate (step 604). The implanted well can be an HV (high voltage) n-well, e.g., HV n-well 300 (FIG. 7B). A P-body for the drain region of the LDMOS transistor is implanted (step 606). The P-body can be non-self aligned with respect to a gate (as shown in process 600)—i.e., the P-body is implanted prior to formation of the gate and/or gate oxide. Alternatively, the P-Body can be self-aligned with respect to a gate—i.e., the P-body can be implanted after formation of the gate and/or gate oxide. As shown in FIG. 7C, a P-body 330 is implanted into HV n-well 300.

Figure 7D:
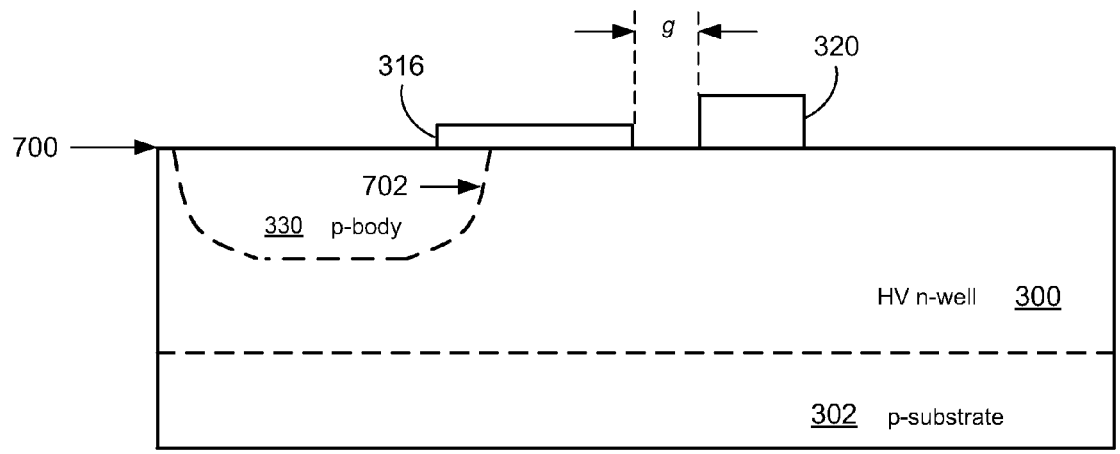

The gate oxides of the LDMOS transistor are formed (step 608). Referring to the example of FIG. 7D, a first gate oxide 316 is formed on a surface 700 of substrate 302 over HV n-well 300 and an inner edge 702 of P-body 330, and second gate oxide 320 is formed over HV n-well 300. Gate oxide 316 can be formed a pre-determined distance (g) from gate oxide 320. In one implementation, gate oxide 316 abuts gate oxide 320 (as shown in FIGS. 3B-3C). In one implementation, gate oxide 324 is thicker than gate oxide 316 (as shown in FIG. 7C). Alternatively, each of gate oxides 316, 320 can have a thickness that is substantially the same. In one implementation, each of gate oxides 316, 320 are formed at different times within a fabrication process. For example, if a shallow drain (e.g., N-LD 324) is to be self aligned with respect to first gate 310, then gate oxide 316 will be formed prior to gate oxide 320, and the shallow drain implant step (e.g., step 612 below) will occur some time after formation of gate oxide 316 but before formation of gate oxide 320.

Figure 7E:
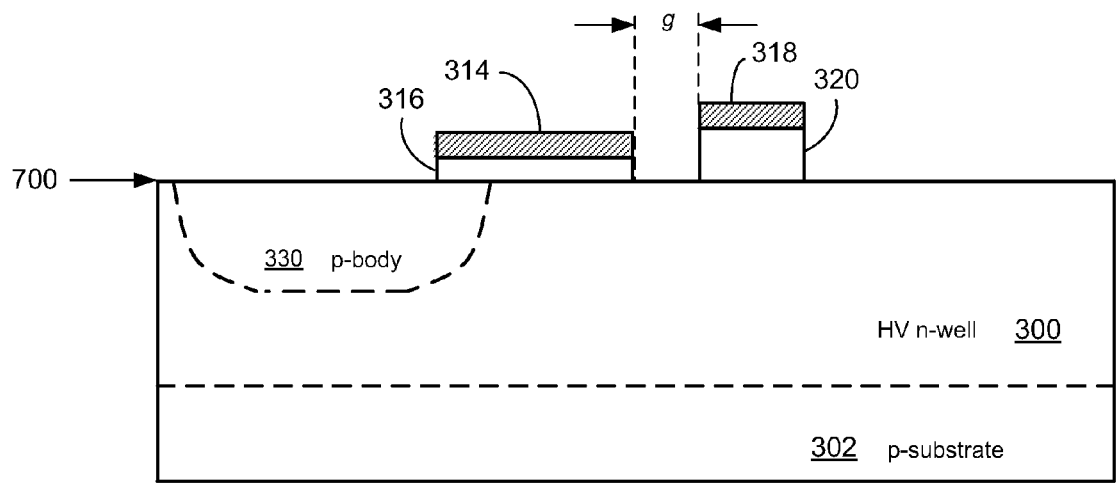

A conductive layer is deposited over the gate oxides of the LDMOS transistor (step 610). The conductive layer can be a layer of polysilicon. Referring to the example of FIG. 7E, a first conductive layer 314 is deposited over gate oxide layer 316 and a second conductive layer 318 is deposited over gate oxide 320.

Figure 7F:
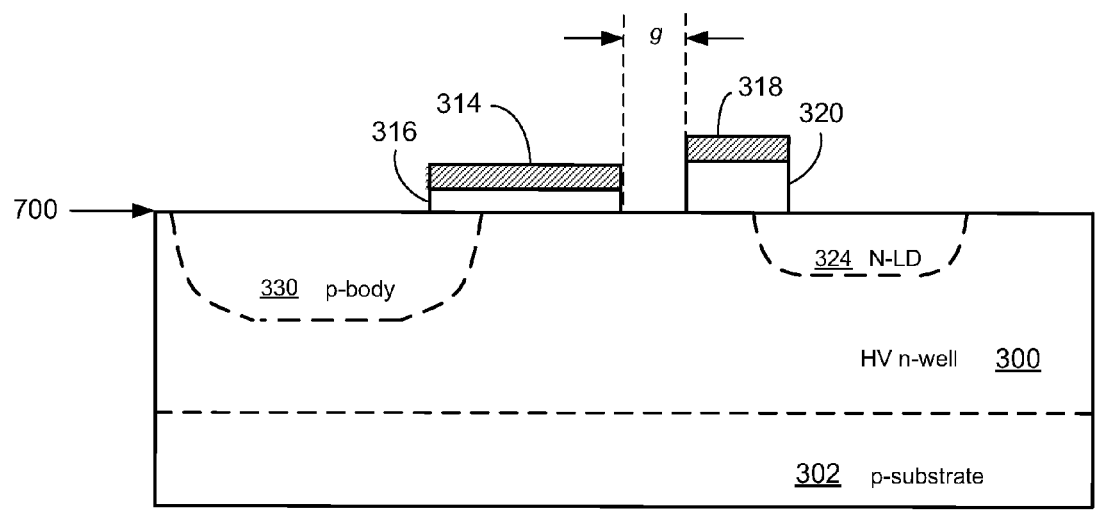

A shallow drain is implanted for the drain of the LDMOS transistor (step 612). In the example of FIG. 7F, the shallow drain is N-LD 324. N-LD 324 can self aligned with respect to a gate, e.g., the gate formed by second conductive layer 318 and gate oxide 320 (as shown in FIG. 7F). Alternatively, N-LD 324 can be non-self aligned—i.e., the shallow drain can be implanted prior to formation of both of gate oxides 316, 320.

Figure 7G:
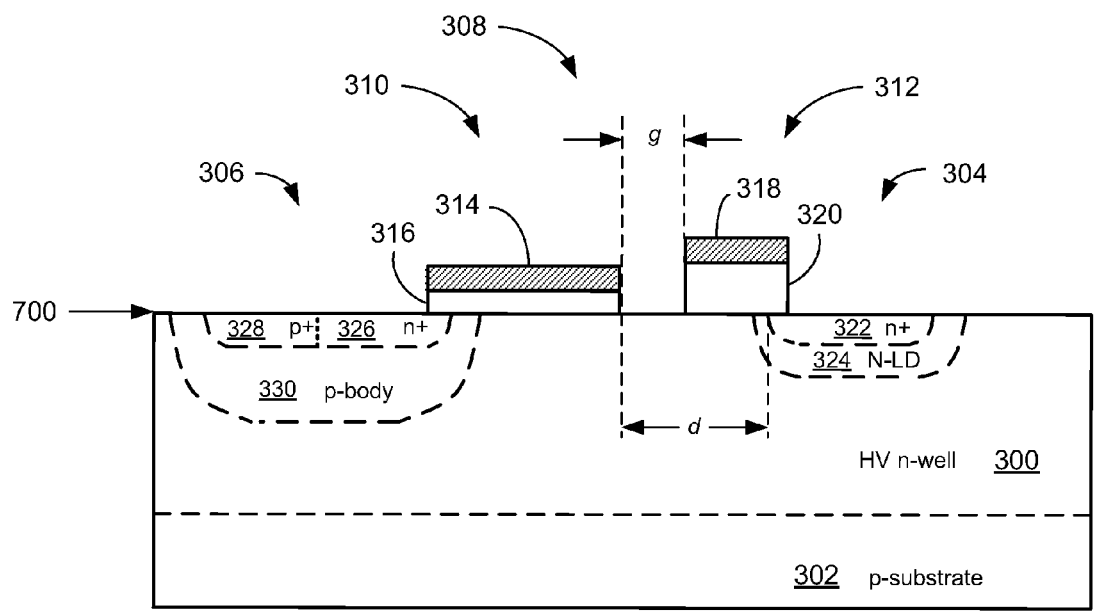

The n+ regions and p+ regions of the LDMOS transistor are implanted (step 614). As shown in FIG. 7G, a p+ region 328 and an n+ region 326 are implanted in the source region of the LDMOS transistor. An n+ region 322 is also implanted in the drain region of the LDMOS transistor. P+ regions 328 and n+ regions 326, 328 are highly doped (relative to N-LD 324), and provide low-resistivity ohmic contacts for the LDMOS transistor. N+ region 322 can be self-aligned with respect to a gate—e.g., the gate formed by second conductive layer 318 and gate oxide 320.

A number of implementations have been described. Nevertheless, it will be understood that various modifications may be made. For example, first transistor 214 and second transistor 216 (of switching circuit 210) can be formed to include any of LDMOS transistor structures shown in FIGS. 3A-3C, 4A-4B and 5. A dual gate transistor design as described above can be used within other CMOS transistor devices, e.g., conventional PMOS transistors, NMOS transistors to achieve alignments (e.g., self-alignments) of implants—e.g., drain implants or source implants. First transistor 216 can be a PMOS transistor, or a P-type LDMOS transistor as described in U.S. patent application Ser. No. 10/714,141, filed on Nov. 13, 2003, incorporated herein by reference. In addition, conventional single gate LDMOS transistors, as described in U.S. patent application Ser. No. 10/714,141, can be used with a dual gate LDMOS transistor described above to implement switching circuit 210. For example, first transistor 214 can be implemented using a dual gate transistor structure as described in FIG. 3D, and second transistor 216 can be implemented with a conventional single gate LDMOS transistor structure having a thin gate oxide.

As discussed above, a LDMOS transistor can be fabricated on an n-type substrate. In such an implementation, an SOI (silicon-on-insulator) insulation layer can be deposited (or grown) on the n-type substrate. Accordingly, other implementations are within the scope of the following claims.

What is claimed is:

1. A method of fabricating a transistor having a source region, a drain region, and a gate on a substrate, the method comprising:

implanting, into a surface of the substrate, a first impurity region (300) with a first volume and a first surface area, the first impurity region being of a first type;

implanting, into a source region of the transistor, a second impurity region (330) with a second volume and a second surface area in the first surface area of the first impurity region, the second impurity region being of an opposite second type relative to the first type;

implanting, into a drain region of the transistor, a third impurity region (324) with a third volume and a third surface area, the third impurity region being of the first type;

forming a first gate oxide (316) and a second gate oxide (320) between the source region and the drain region of the transistor, the first gate oxide being formed a predetermined non-zero distance (g) from the second gate oxide;

covering the first gate oxide and the second gate oxide with a conductive material (314, 318) to form a first gate and a second gate, respectively, of the transistor; and implanting, into the drain region of the transistor, a fourth impurity region (322) with a fourth volume and a fourth surface area, the fourth impurity region being of the first type, the fourth impurity region having an offset spacing from the first gate and being self-aligned with respect to the second gate.

2. The method of claim 1, further comprising implanting, into the drain region of the transistor, a fifth impurity region (324) with a fifth volume and a fifth surface area in the first surface area of the first impurity region.

3. The method of claim 2, wherein the sixth impurity region is self aligned to the first gate of the transistor and is implanted prior to formation of the second gate oxide.

4. The method of claim 2, wherein the sixth impurity region is self aligned to the second gate of the transistor.

5. The method of claim 2, wherein the sixth impurity region is non-self aligned with respect to the first gate and the second gate.

6. The method of claim 1, comprising forming the first gate oxide and the second gate oxide with substantially the same thickness.

7. The method of claim 1, comprising forming the first gate oxide thinner than the second gate oxide.

8. The method of claim 1, comprising forming a second transistor in the substrate, including forming a third gate and a fourth gate, the third gate including a third gate oxide layer, the fourth gate including a fourth gate oxide layer.

9. The method of claim 8, comprising forming the third gate oxide layer and the fourth gate oxide layer with substantially the same thickness.

10. The method of claim 9, wherein the third gate oxide layer and the fourth gate oxide layer are formed as thick gate oxides.

11. The method of claim 10, comprising forming the third gate oxide layer and fourth gate oxide layer with a thickness of approximately 75 Angstroms for 3.3V applications or a thickness of approximately 350 Angstroms for 12V applications.

12. The method of claim 8, comprising forming the third gate to abut the fourth gate.

13. The method of claim 8, comprising forming the third gate a pre-determined non-zero distance (g) from the fourth gate.

* * * * *